United States Patent
Luan et al.

(10) Patent No.: US 12,081,849 B2
(45) Date of Patent: Sep. 3, 2024

(54) PHOTOSENSITIVE ASSEMBLY, CAMERA MODULE AND MANUFACTURING METHOD THEREOF

(71) Applicant: NINGBO SUNNY OPOTECH CO., LTD, Zhejiang (CN)

(72) Inventors: Zhongyu Luan, Zhejiang (CN); Zhen Huang, Zhejiang (CN); Li Liu, Zhejiang (CN); Hongfeng Gan, Zhejiang (CN); Tinghua Li, Zhejiang (CN); Xinxiang Sun, Zhejiang (CN)

(73) Assignee: NINGBO SUNNY OPOTECH CO., LTD, Zhejiang (CN)

( * ) Notice: Subject to any disclaimer, the term of this patent is extended or adjusted under 35 U.S.C. 154(b) by 183 days.

(21) Appl. No.: 17/635,121

(22) PCT Filed: Jul. 8, 2020

(86) PCT No.: PCT/CN2020/100862
§ 371 (c)(1),
(2) Date: Feb. 14, 2022

(87) PCT Pub. No.: WO2021/027445
PCT Pub. Date: Feb. 18, 2021

(65) Prior Publication Data
US 2022/0303436 A1    Sep. 22, 2022

(30) Foreign Application Priority Data

Aug. 15, 2019    (CN) .......................... 201910753723.1

(51) Int. Cl.
*H04N 23/54*    (2023.01)
*H04N 23/55*    (2023.01)
(Continued)

(52) U.S. Cl.
CPC ............. *H04N 23/54* (2023.01); *H04N 23/55* (2023.01); *H04N 23/57* (2023.01); *H05K 1/181* (2013.01);
(Continued)

(58) Field of Classification Search
CPC ........ H04N 23/54; H04N 23/55; H04N 23/57; H05K 1/0271; H05K 1/181;
(Continued)

(56) References Cited

U.S. PATENT DOCUMENTS

| | | | | |
|---|---|---|---|---|
| 2002/0076537 | A1* | 6/2002 | Chuang | H01L 24/31 428/209 |
| 2004/0226742 | A1* | 11/2004 | Wyrzykowska | H05K 3/303 174/267 |

(Continued)

FOREIGN PATENT DOCUMENTS

| | | |
|---|---|---|
| CN | 104954654 | 9/2015 |
| CN | 104967767 | 10/2015 |

(Continued)

OTHER PUBLICATIONS

International Search Report issued Sep. 22, 2020, in International (PCT) Application No. PCT/CN2020/100862, with English translation.

(Continued)

*Primary Examiner* — Antoinette T Spinks
(74) *Attorney, Agent, or Firm* — Wenderoth, Lind & Ponack, L.L.P.

(57) ABSTRACT

The present application relates to a photosensitive assembly, including a circuit board, a photosensitive chip and a metal wire. A first surface of the circuit board has a protrusion structure and a chip attachment area, and the protrusion structure is distributed in the chip attachment area. The photosensitive chip is attached to the first surface by an (Continued)

adhesive, and the adhesive is at least disposed between the top surface of the protrusion structure and the bottom surface of the photosensitive chip. The metal wire electrically connects the photosensitive chip and the circuit board in a wire bonding manner. The present application further provides a corresponding manufacturing method for a camera module and a photosensitive assembly. The present application can avoid or suppress the deformation of the photosensitive chip at a smaller cost of space size. The photosensitive assembly and the camera module of the present application can improve the structural strength of the circuit board. The photosensitive assembly and the camera module of the present application can improve the heat dissipation efficiency of the photosensitive chip.

18 Claims, 8 Drawing Sheets

(51) Int. Cl.
 *H04N 23/57* (2023.01)
 *H05K 1/18* (2006.01)
 *H05K 3/30* (2006.01)
(52) U.S. Cl.
 CPC ... *H05K 3/303* (2013.01); *H05K 2201/10151* (2013.01); *H05K 2203/1316* (2013.01)
(58) Field of Classification Search
 CPC .......... H05K 2201/10121; H05K 2201/10151; H05K 2203/049; H05K 2203/1316; H05K 3/303; H05K 3/305; H05K 3/4691
 See application file for complete search history.

(56) References Cited

U.S. PATENT DOCUMENTS

| | | | |
|---|---|---|---|
| 2006/0268144 A1* | 11/2006 | Tan | H04N 23/54 348/340 |
| 2006/0292732 A1 | 12/2006 | Kinsman | |
| 2019/0364184 A1 | 11/2019 | Wang et al. | |
| 2022/0278151 A1* | 9/2022 | Luan | H01L 24/81 |
| 2022/0303436 A1* | 9/2022 | Luan | H05K 3/303 |

FOREIGN PATENT DOCUMENTS

| | | | |
|---|---|---|---|
| CN | 105472216 | | 4/2016 |
| CN | 105681637 | | 6/2016 |
| CN | 105721754 | | 6/2016 |
| CN | 106303164 | | 1/2017 |
| CN | 107734227 | | 2/2018 |
| CN | 207251755 | | 4/2018 |
| CN | 208956159 | | 6/2019 |
| CN | 209046749 | | 6/2019 |
| CN | 209046749 U | * | 6/2019 |
| EP | 3 998 768 | | 5/2022 |
| JP | 2018-073957 | | 5/2018 |

OTHER PUBLICATIONS

Extended European Search Report issued Sep. 9, 2022, in corresponding European Application No. 20853455.2.

* cited by examiner

PHOTOSENSITIVE ASSEMBLY, CAMERA MODULE AND MANUFACTURING METHOD THEREOF

RELATED APPLICATIONS

The present application claims the priority of the Chinese patent application No. 201910753723.1 filed on Aug. 15, 2019 under the title of "photosensitive assembly, camera module and manufacturing method thereof", and hereby includes the entire content of the above application by reference.

FIELD OF THE INVENTION

The present invention relates to the technical field of camera modules. Specifically, the present invention relates to a camera module, a photosensitive assembly for the camera module, and a manufacturing method thereof.

BACKGROUND OF THE INVENTION

With the popularization of mobile electronic devices, the related technologies of camera modules used in the mobile electronic devices to help users obtain images (such as videos or images) have been developed and advanced rapidly, and in recent years, camera modules have been widely used in many fields such as medical treatment, security, industrial production and so on. In order to meet more and more extensive market demands, high pixels, small size, and large aperture are the irreversible development trends of existing camera modules. However, it is very difficult to achieve the three requirements of high pixels, small size, and large aperture in a same camera module. For example, the compact development of mobile phones and the increase in the screen-to-body ratio of the mobile phones makes the space inside the mobile phone for front camera modules smaller and smaller; the number of rear camera modules is increasing, and the area occupied is also increasing, resulting in the other configurations of mobile phones, such as battery size and motherboard size, have been reduced accordingly. In order to avoid the sacrifice of other configurations, the market hopes that the size of rear camera modules can be reduced. On the other hand, the market has also put forward higher and higher demands for the imaging quality of camera modules.

In the field of compact camera modules (such as those used in mobile phones), in order to reduce the size of camera modules and improve manufacturing efficiency, a molding process is adopted to directly form lens assemblies or brackets of other components on the circuit board (such as MOB or MOC and other process schemes). Specifically, the camera module may include a photosensitive assembly and a lens assembly, and lens group of the lens assembly and other optical elements are provided on a photosensitive path of a photosensitive element (usually a photosensitive chip) of the photosensitive assembly. It should be noted that in some solutions, a color filter can be directly installed on the photosensitive assembly to form a part of the photosensitive assembly, but in other solutions, the photosensitive assembly may not include a color filter, but the color filter is made into an independent color filter assembly or installed on the light transmission path in other forms. Therefore, the lens assembly can sometimes be understood as a combination of light transmitting elements such as the lens groups, the color filters, and supporting structures thereof, and this combination can sometimes be referred to as a light transmitting assembly.

Further, the photosensitive assembly may include a circuit board and a molding body integrally molded on the circuit board. In a MOC packaging process, the photosensitive element is pre-attached to the circuit board, and then the molding body is formed on the circuit board through a molding process. The molding body can embed part of a non-photosensitive area of the photosensitive element. In the camera module, the combination of the circuit board and the molding body, and the combination of the molding body and the photosensitive chip are all rigid combinations. The combination is very strong and often requires destructive methods to be removed. At the same time, the circuit board and the photosensitive chip are combined by glue, which is a relatively flexible combination. In addition, the coefficient of thermal expansion (CTE) of the circuit board, the molding body, and the photosensitive chip are different. When the environmental temperature changes greatly during the manufacturing process (for example, the forming of molding materials needs to increase the temperature to 150 degrees Celsius or more. In the subsequent manufacturing process of producing the camera module, the ambient temperature may also change many times), the expansion degree of the circuit board and the molding body are different, and the expansion speed of the circuit board and the molding body are also different. Wherein, the shrinkage degree of the photosensitive chip is often the smallest. However, because the combination of the circuit board and the molding body is a rigid combination, the circuit board and the molding body will generate stress, causing the circuit board and the molding body to bend, and this bending will drive the photosensitive chip to deform. FIG. 18 shows a schematic diagram of the principle of the deformation of the photosensitive chip caused by the bending of the circuit board and the molding body. It should be noted that, FIG. 18 is exaggerated for ease of understanding. In fact, the bending amount may be only ten to twenty microns, but this degree of bending is enough to affect the image quality. For example, this kind of bending may cause the field curvature of the camera module to be too large. At this time, the image obtained by the camera module appears to have a normal effect at center but a poor effect at edges.

Further, under the current trend of device miniaturization, in the current mainstream compact camera modules (such as camera modules used in mobile phones), most of the circuit boards tend not to add additional heat dissipation members to avoid increasing the size of the camera module. However, on the other hand, the current high-end camera module has developed to 48 million pixels, and camera modules with higher pixels and higher frame rates will appear in the future, and the corresponding photosensitive chip power will be greatly improved. The inventor of the present application discovered that as the heat generated by the photosensitive chip increases, this heat accumulation causes the photosensitive chip to deform, which is one of the important factors leading to the degradation of imaging quality. Specifically, in the working state, as the internal temperature of the camera module increases, the circuit board and the photosensitive chip will bend, thereby reducing the image quality. In other words, for high-pixel, high-frame-rate photosensitive chips, even if they are not packaged by molding, they will be affected by temperature and bend. That is, neither molding or non-molding packaging can solve the bending problem of high pixels and large chips. Therefore, there is an urgent need for a solution that can use a smaller cost of space size to avoid or suppress the deformation of the photosensitive chip, and an urgent need for a solution that can use the smaller cost of space size to ensure the imaging quality of the camera module (especially in the long-term working condition of the image quality).

SUMMARY OF THE INVENTION

The purpose of the present invention is to overcome the shortcomings of the prior art and provide a solution for a photosensitive assembly and a camera module.

In order to solve the above technical problems, the present invention provides a photosensitive assembly including: a circuit board having a first surface for attaching a photosensitive chip and a second surface opposite to the first surface, the first surface having a protrusion structure, and the protrusion structure being distributed on a chip attachment area of the circuit board; a photosensitive chip attached to the first surface through an adhesive, the adhesive being arranged at least between a top surface of the protrusion structure and a bottom surface of the photosensitive chip; and a metal wire electrically connects the photosensitive chip and the circuit board in a wire bonding manner.

Herein, the adhesive covers the chip attachment area, and the top surface of the protrusion structure is a flat surface.

Herein, the adhesive fills a gap between the bottom surface of the photosensitive chip and the chip attachment area, and the thickness of the adhesive is greater than a protrusion height of the protrusion structure.

Herein, the protrusion structure is a plurality of pillars distributed in the chip attachment area in a hash manner.

Herein, the protrusion structure is one or more strip-shaped dams.

Herein, the strip-shaped dam is a linear dam, or a ring-shaped dam, or a tortuous dam formed by zigzag extension within the chip attachment area.

Herein, the protrusion height of the protrusion structure is 5 micrometers to 40 micrometers.

Herein, the protrusion height of the protrusion structure is 10 micrometers to 40 micrometers.

Herein, the circuit board is a PCB board.

Herein, the photosensitive assembly further includes a molding portion formed on the first surface and surrounding the photosensitive chip.

Herein, there is a gap between the molding portion and the photosensitive chip.

Herein, the molding portion extends toward the photosensitive chip and contacts the photosensitive chip, and the molding portion covers the metal wire.

Herein, a root part of the protrusion structure is located inside the circuit board, and the protrusion structure is grown based on a seed layer inside the circuit board.

Herein, the root part of the protrusion structure extends to the second surface and penetrates through the circuit board.

Herein, the protrusion structure is attached to the first surface of the circuit board.

Herein, the protrusion structure is attached to the first surface of the circuit board through an SMT process.

Herein, the protrusion structure is a metal pillar or a metal dam.

Herein, the protrusion structure includes a first annular dam on an outer side and a second annular dam on an inner side, and the protrusion height of the first annular dam is greater than the protrusion height of the second annular dam.

Herein, the protrusion structure is a ring-shaped dam with at least one opening, and the adhesive is arranged between the top surface of the protrusion structure and the bottom surface of the photosensitive chip and the adhesive is cured to support the photosensitive chip, and the protrusion height of the protrusion structure is 10 micrometers to 30 micrometers.

According to another aspect of the present application, there also provides a method for manufacturing a photosensitive assembly including: 1) preparing a circuit board, wherein the circuit board has a first surface for attaching a photosensitive chip and a second surface opposite to the first surface, the first surface has a protrusion structure, and the protrusion structure is distributed on a chip attachment area of the circuit board; 2) placing the first surface facing upwards, arranging adhesive on the chip attachment area of the first surface, wherein the adhesive is arranged on at least a top surface of the protrusion structure; 3) contacting a bottom surface of the photosensitive chip with the adhesive, and then curing the adhesive, thereby bonding the photosensitive chip and the circuit board together; and 4) electrically connecting the photosensitive chip and the circuit board by a metal wire based on a wire bonding manner.

Herein, the method for manufacturing the photosensitive assembly further includes: 5) forming a molding portion on the first surface of the circuit board, wherein the molding portion surrounds the photosensitive chip, and there is a gap between the molding portion and the photosensitive chip, or the molding portion extends to the photosensitive chip and contacts the photosensitive chip.

Herein, in the step 1), the protrusion structure is a plurality of pillars distributed in the chip attachment area in a hash manner, or one or more strip-shaped dams; in the step 2), the adhesive is coated on the chip attachment area of the circuit board; in the step 3), the bottom surface of the photosensitive chip is brought into contact with the adhesive, and then the photosensitive chip is continuously pressed to squeeze the adhesive so that the adhesive fills the gap between the bottom surface of the photosensitive chip and the chip attachment area.

Herein, the step 1) includes the following sub-steps: 11) preparing a circuit board embryonic board, wherein the circuit board embryonic board has a through hole or a slot, and the through hole or the slot has a metal seed layer therein; and 12) planting a metal layer on the metal seed layer so that the metal layer grows beyond the first surface to form the protrusion structure.

Herein, the step 12) inlcudes the following sub-steps: 121) covering an upper surface of the circuit embryonic board with a mask, wherein the mask has an opening, and a longitudinal section of the opening has a first width, and a longitudinal section of the through hole or the slot has a second width, and the difference between the first width and the second width is less than 15% of the second width; 122) using electroplating, deposition or sputtering methods to grow a metal pillar or a metal dam on the seed layer in the through hole or the slot to form a protrusion structure beyond the first surface; and 123) removing the mask.

Herein, the step 1) further includes: attaching the electronic element and the protrusion structure to the circuit board in a same process step based on the SMT process.

According to another aspect of the present application, there also provides a camera module includes: a lens assembly; and any of the aforementioned photosensitive assemblies.

Compared with the prior art, the present application has at least one of the following technical effects:

1. The photosensitive assembly and camera module of the present application can avoid or suppress the deformation of the photosensitive chip with the smaller cost of space size.

2. The photosensitive assembly and camera module of the present application can improve the structural strength of the circuit board.

3. The photosensitive assembly and camera module of the present application can improve the heat dissipation efficiency of the photosensitive chip.

4. The photosensitive assembly and camera module of the present application can ensure the imaging quality of the camera module with use a smaller cost of space size.

5. The photosensitive assembly and camera module of the present application are particularly suitable for camera modules with high pixels and high frame rate.

6. The photosensitive assembly and camera module of the present application are particularly suitable for combining with MOC and MOB technologies.

7. The photosensitive assembly and camera module of the present application have higher production efficiency.

8. The photosensitive assembly of the present application can inhibit the bending of the photosensitive chip by two aspects of effects of avoiding excessive heat accumulation and increasing the structural strength. Therefore, the thickness of package part and heat dissipation rib on the back of the circuit board can be relatively reduced. In other words, the present application can achieve the effect of suppressing the bending of the photosensitive chip at a smaller cost of thickness.

DETAIL DESCRIPTION OF THE INVENTION

Figure 1:
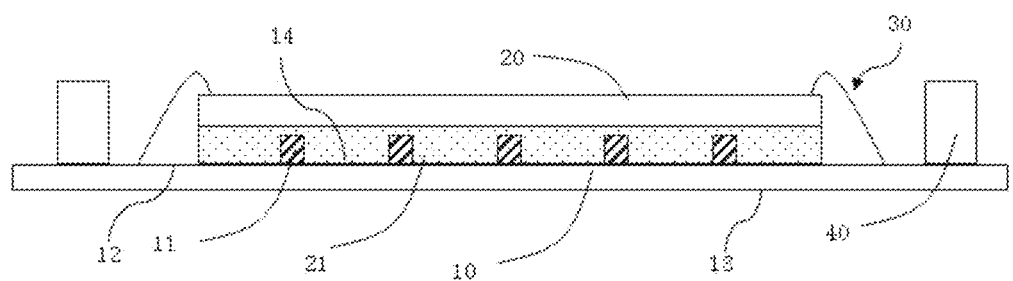
FIG. 1 shows a schematic cross-sectional view of a photosensitive assembly 1000 in an example of the present application.

In order to better understand the present application, various aspects of the application will be described in more detail with reference to the accompanying drawings. It should be understood that these detailed descriptions are only descriptions of exemplary examples of the present application, and are not intended to limit the scope of the present application in any way. Throughout the specification, the same reference numerals refer to the same elements. The expression "and/or" includes any and all combinations of one or more of the associated listed items.

It should be noted that in this specification, expressions such as first, second, etc. are only used to distinguish one feature from another feature, and do not represent any restriction on the feature. Therefore, without departing from the teachings of the present application, the first subject discussed below may also be referred to as the second subject.

In the drawings, the thickness, size, and shape of objects have been slightly exaggerated for ease of description. The drawings are only examples and are not drawn strictly to scale.

It should also be understood that the terms "include", "including with", "having", "comprise" and/or "comprising with", when used in this specification, mean that the stated features, wholes, steps, operations, elements and/or components are present, but does not exclude the presence or addition of one or more other features, wholes, steps, operations, elements, components and/or combinations thereof. In addition, when the expression "at least one of . . . " appears after the list of listed features, it modifies the entire listed feature instead of modifying the individual elements in the list. In addition, when describing the examples of the present application, the use of "may" means "one or more examples of the present application". And, the term "exemplary" is intended to refer to an example or illustration.

As used herein, the terms "substantially", "approximately" and similar terms are used as terms representing approximation, not terms representing degree, and are intended to illustrate the inherent deviation in the measurement value or calculated value that will be recognized by those of ordinary skill in the art.

Unless otherwise defined, all terms (including technical terms and scientific terms) used herein have the same meanings as commonly understood by those of ordinary skill in the art to which the present application belongs. It should also be understood that terms (such as those defined in commonly used dictionaries) should be interpreted as having meanings consistent with their meanings in the context of related technologies, and will not be interpreted in an idealized or excessively formal sense unless this is clearly defined in this article.

It should be noted that the examples in the present application and the features in the examples can be combined with each other if there is no conflict. Hereinafter, the present application will be described in detail with reference to the drawings and in combination with the examples.

As mentioned above, with the development of mobile phone camera modules with high pixels and high frame rates, the heat generated by the photosensitive chip is increasing. The inventor of the present application discovered that the superposition of factors such as heat accumulation and the increase in the size of the photosensitive chip (high pixels lead to an increase in the size of the photosensitive chip) makes the photosensitive chip prone to deformation, and the deformation is sufficient to cause the imaging quality of the camera module to decrease. Specifically, under the current development trend of the mobile phone market (mobile phone camera module market), first, the photosensitive chip itself has a large area, high power, and generates a large amount of heat; second, the photosensitive chip has a large area and small thickness, and this ratio causes the chip itself is easily affected by foreign objects; third, the photosensitive chip is affected by the force generated by foreign objects such as circuit boards and molding deformation, which makes the photosensitive chip more susceptible to deformation. Based on this, the applicant proposes a composite substrate that can suppress the aforementioned deformation, and a photosensitive assembly and camera module based on the composite substrate. Hereinafter, the present application will be described in detail with reference to the drawings and in a combination with the examples.

FIG. 1 shows a schematic cross-sectional view of a photosensitive assembly 1000 in an example of the present application. Referring to FIG. 1, in this example, the photosensitive assembly 1000 includes a circuit board 10, a photosensitive chip 20, a metal wire 30 and an electronic component 40. Herein, the circuit board 10 has a first surface 12 for attaching the photosensitive chip and a second surface 13 opposite to the first surface 12, and the first surface has protrusion structures 11, and the protrusion structures 11 are distributed in the chip attachment area 14 of the circuit board 10. The photosensitive chip 20 is attached to the first surface 12 through an adhesive 21, and the adhesive 21 covers the entire chip attachment area 14. In this example, a top surface of the protrusion structure 11 may be a flat surface, so as to arrange adhesive material on the top surface and to enhance the firmness of the bonding between a back surface of the photosensitive chip and the first surface of the circuit board. In this example, the top surface of the protrusion structure 11 can be a flat surface, and the height of all protrusion structures is substantially equal, so that the uniformity of the thickness of the glue (i.e., the adhesive 21) can be ensured, and the flatness of chip mounting can be increased. In one example, the protrusion structure 11 may be made of copper pillars by electroplating or deposition; in another example, the protrusion structure may be soldered to the circuit board using SMT (Surface Mount Technology). Furthermore, considering the production efficiency, the protrusion structure can be attached to the circuit board based on the SMT process in the same process step as attaching the electronic components. In this example, the metal wire 30 electrically connects the photosensitive chip 20 and the circuit board 10 by a wire bonding manner. One end of the metal wire 30 can be led out from a top surface of the photosensitive chip 20, and the other end can be connected to a non-chip attachment area of the first surface 12 of the circuit board 10. The non-chip attachment area refers to an area outside the chip attachment area 14. Generally speaking, the non-chip attachment area is located around the chip attachment area 14. Wire bonding is a process for electrically connecting the photosensitive chip 20 and the circuit board 10, and its english name is wire bonding, which can also be called "bonding", "wire bond" or "wire stripping". Using the wire bonding process, a pad of the photosensitive chip can be electrically connected to a pad of the circuit board. The pad here can be regarded as a port for chip data input and output. The pad of the circuit board can be formed by removing an ink layer to expose a copper layer of the circuit board. In this case, the pad is recessed downward. For example, the pad of the circuit board can also be made by tin screen printing. In this case, the pad can be protruded upward, but the pad is different from the protrusion structure 11 described in this example. Generally speaking, metal pillars (such as copper pillars) grown by electroplating or deposition help to form a flat top surface. In the prior art, there is also a BGA process, that is, a Ball Grid Array packaging process. Under this process, the chip and the circuit board are generally electrically connected by soldering tin balls on a back of the chip. However, the electrical connection method may cause the adhesive material on the back of the chip to be difficult to coat evenly, or the adhesive material may contaminate solder joints and cause reliability problems. The wire bonding process in this example can avoid the above problems. In some examples, the pads on the photosensitive chip are located on a front surface of the photosensitive chip, and pads on the corresponding circuit board are far away from the photosensitive chip mounting area, and the glue on the back of the chip is not easy to contaminate the pad. In this example, the electronic component 40 can be mounted on the non-chip attachment area of the first surface 12 of the circuit board 10. Specifically, the electronic component 40 may be located at outer side of the metal wire 30. In this example, the adhesive 21 fills the gap between a bottom surface of the photosensitive chip 20 and the chip attachment area 14, and thickness of the adhesive 21 is greater than a protrusion height of the protrusion structure 11. The protrusion structure 11 can increase the contact area of the adhesive 21, so that stress per unit area of the chip attachment area 14 of the circuit board 10 is reduced, so that stress acting on the photosensitive chip per unit area of the chip attachment area 14 is reduced, thereby reducing the bending of the photosensitive chip 20. Further, in this example, the protrusion height of the protrusion structure 11 is 5-40 micrometers, and the protrusion structure 11 has a larger surface area, which can absorb more heat, and increase the heat dissipation efficiency. It should be noted that the protrusion height in this example refers to a height from the first surface 12 to the top surface of the protrusion structure 11. Further, in an example of the present application, the protrusion height of the protrusion structure 14 may preferably be 10 micrometers to 40 micrometers. Range of the protrusion height can further increase the thickness and structural strength of the photosensitive chip mounting area, enhance ability of this part to resist stress, and reduce the bending of this part of the circuit board 10. Optionally, a material of the protrusion structure can have a coefficient of thermal expansion (CTE) of $10*10^{-6}$ to $25*10^{-6}/°$ C., so as to be close to the coefficient of thermal expansion of materials such as the circuit board.

Figure 2:
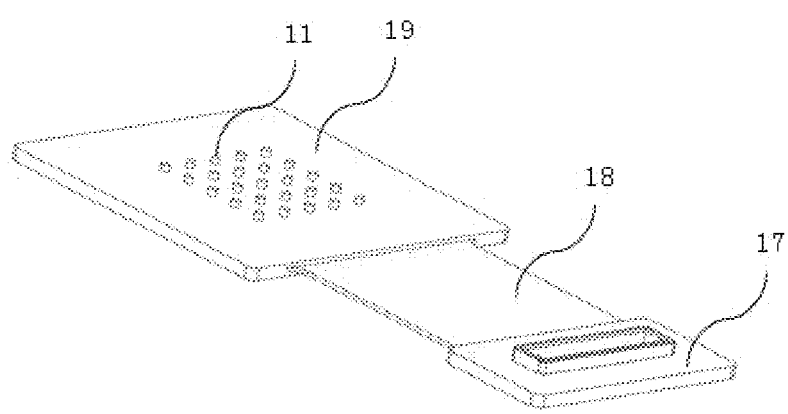
FIG. 2 shows a three-dimensional schematic diagram of a circuit board 10 with a first surface having an array of pillars in an example of the present application.

Further, in an example of the present application, the protrusion structure 11 may be a plurality of pillars distributed in the chip attachment area 14 in a hash manner. Specifically, the protrusion structure 11 may be an array of N*M pillars (N and M are both integers). FIG. 2 shows a three-dimensional schematic diagram of a circuit board 10 with a first surface having an array of pillars in an example of the present application. Referring to FIG. 2, the first surface 12 of the circuit board 10 has a rectangular array of pillars. The circuit board 10 may include a circuit board main body 19, a flexible connection stripe 18 and a connector 17. The circuit board main body 19 may be a PCB board, also called a hard board. The circuit board main body 19 is mainly involved herein. For the convenience of description, the circuit board is sometimes used directly as the circuit board main body herein.

Figure 3:
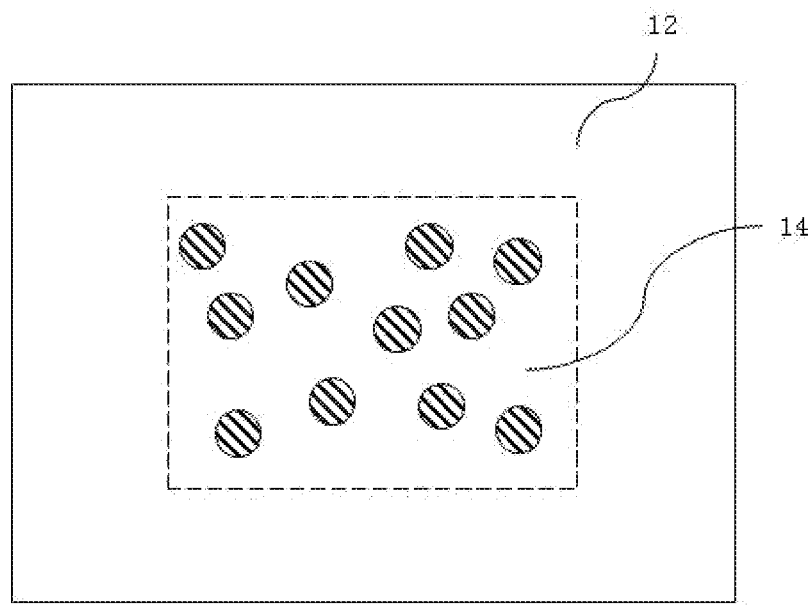
FIG. 3 shows a schematic top view of a circuit board 10 according to another example of the present application.

Furthermore, FIG. 3 shows a schematic top view of a circuit board 10 according to another example of the present application. Referring to FIG. 3, in this example, a plurality of pillars are irregularly distributed in the chip attachment area 14 of the first surface 12.

Figure 4:
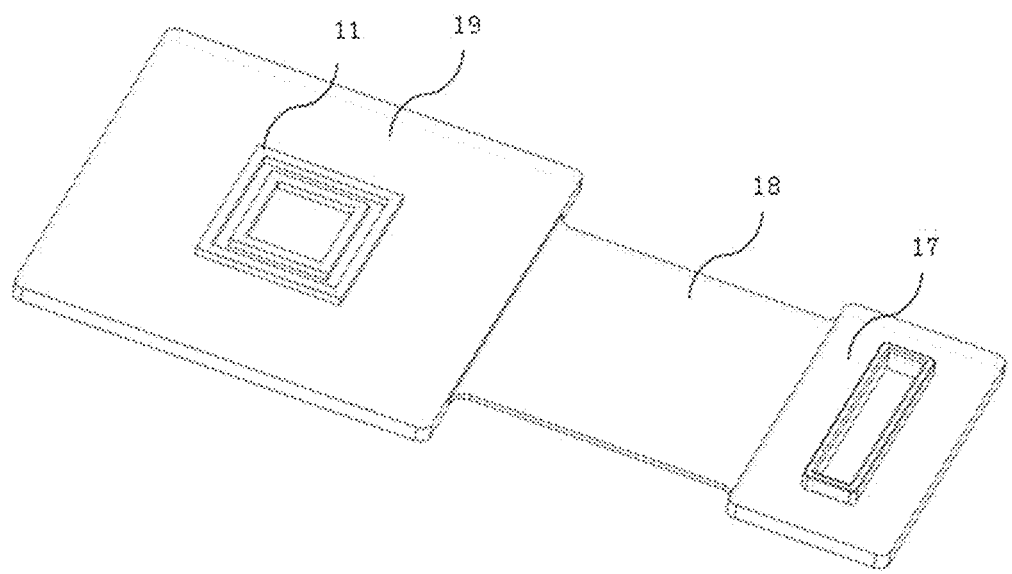
FIG. 4 shows a three-dimensional schematic diagram of a circuit board 10 according to still another example of the present application.

Furthermore, FIG. 4 shows a three-dimensional schematic diagram of a circuit board 10 according to still another example of the present application. Referring to FIG. 4, in this example, the protrusion structure 11 is a "homocentric squares"-shaped dam. Specifically, the "homocentric squares"-shaped dam can be composed of two ring-shaped dams, one of which is a large ring and the other is a small ring, and the two ring-shaped dams are in a state where the large ring surrounds the small ring. In other examples of the present application, the protrusion structure 11 may also be other deformed structures, for example, it may be one or more strip-shaped dams. Wherein, the strip-shaped dam can be a linear dam, it can also be a ring-shaped dam (which can be regarded as a ring formed by the zigzag extension of the strip), or it can be other types of zigzag dams formed by zigzag extension within the range of the chip attachment area. It should be noted that in addition to the circuit board main body 19 shown in FIG. 4, the flexible connection stripe 18 and the connector 17 are also shown. The two ring shapes of the "homocentric squares" shape can be rectangular similar to the shape of the photosensitive chip, and the matching of the shapes can make the stress generated by the chip evenly distributed on the "homocentric squares"-shaped dam and be conducted out through the dam.

Figure 19:
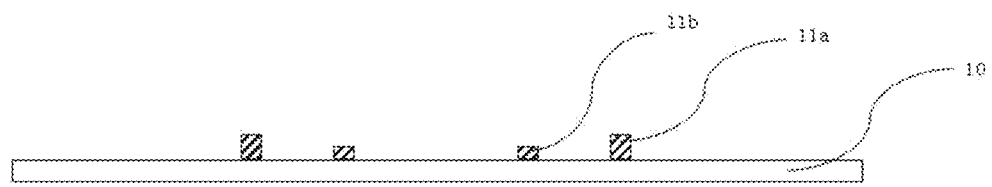
FIG. 19 shows a schematic cross-sectional view of a circuit board 10 with a "homocentric squares"-shaped dam in an example of the present application.

Further, FIG. 19 shows a schematic cross-sectional view of a circuit board 10 with a "homocentric squares"-shaped dam in an example of the present application. Referring to FIG. 19, the "homocentric squares"-shaped dam may include an outer ring dam 11a and an inner ring dam 12b, and a height of the outer ring dam 11a may be higher than a height of the inner ring dam 11b. In this example, the outer ring dam 11a carries at least three sides (or three strip-shaped edge areas) of the photosensitive chip 20, so flatness of the photosensitive chip 20 can be guaranteed. On this basis, the height of the inner ring dam 11b is lower than that of the outer ring dam 11a. These two dams can form a "curved installation surface", and the inner ring dam 11b holds more glue than the outer ring dam 11a, the more glue is, the greater the shrinkage of the glue is, so that an inner ring area of the photosensitive chip can be pulled by the glue to bend toward the circuit board, forming a "bowl-shaped" photosensitive surface. Generally speaking, an imaging surface of the lens is also a curved surface similar to a "bowl-shape" (i.e., curvature of field), which makes a shape of a photosensitive surface of the photosensitive chip close to that of the imaging surface of the lens, reduces the field curvature of the camera module, and improves the imaging quality of the camera module.

Figure 20:
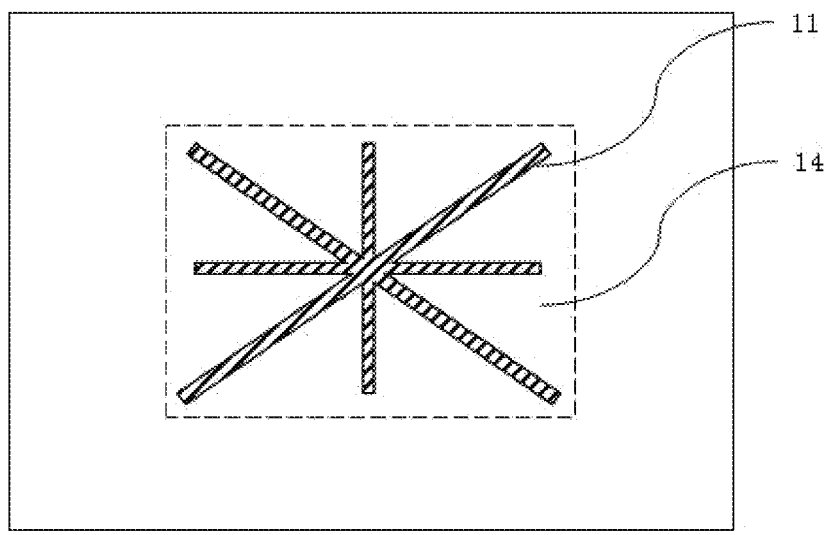
FIG. 20 shows a schematic top view of a circuit board 10 having a "Union Jack"-shaped protrusion structure 11 in an example.

In addition, the dam-shaped protrusion structure is not limited to the "homocentric squares" shape. In other examples, the protrusion structure may also be similar to a "cross" shape, a "Union Jack" shape (FIG. 20 shows a top view of the board circuit 10 with a "Union Jack"-shaped protrusion structure 11 in an example), or an "X" shape, etc., to strengthen the intensity of the circuit board and the photosensitive chip in multiple directions such as the X direction, the Y direction (the X direction and the Y direction can be a direction along the long and short sides of the photosensitive chip) and the diagonal direction of the photosensitive chip.

Figure 5:
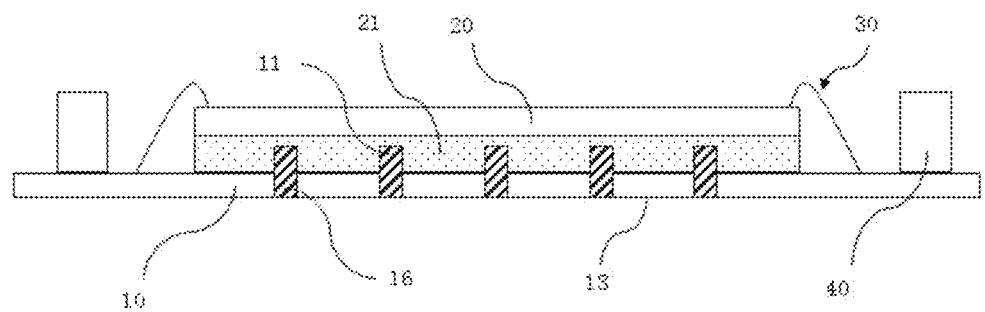
FIG. 5 shows a schematic cross-sectional view of a photosensitive assembly 1000 in another example of the present application.

Further, in an example of the present application, the photosensitive assembly may further include a molding portion formed on the first surface and surrounding the photosensitive chip. The molding portion may have a top surface suitable for mounting a lens assembly. In one example, there is a space between the molding portion and the photosensitive chip, which is the MOB solution. In another example, the molding portion extends to the photosensitive chip and contacts the photosensitive chip, and the molding portion covers the metal wire, which is the MOC solution. Further, FIG. 5 shows a schematic cross-sectional view of a photosensitive assembly 1000 in another example of the present application. Referring to FIG. 5, in this example, a root part 16 of the protrusion structure 11 is located inside the circuit board 10. The root part 16 of the protrusion structure 11 extends toward the second surface 13 and penetrates through the circuit board 10. In this example, because the protrusion structure 11 penetrates through the circuit board 10, it is beneficial to conduct heat to the bottom surface of the circuit board, and has a better heat dissipation effect. The protrusion structure extends to the inside of the circuit board, which can strengthen the structural strength of the photosensitive assembly in the chip attachment area, reduces the influence of the bending of the circuit board on the photosensitive assemblys in the area.

Figure 6:
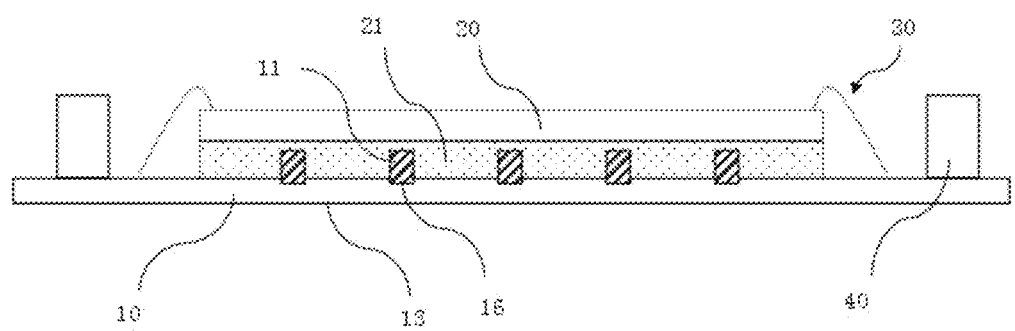
FIG. 6 shows a schematic cross-sectional view of a photosensitive assembly 1000 in a modified example of the present application.

FIG. 6 shows a schematic cross-sectional view of a photosensitive assembly 1000 in a modified example of the present application. In this modified example, the root part 16 of the protrusion structure 11 of the photosensitive assembly 1000 is located inside the circuit board 10, but the protrusion structure 11 does not penetrate through the circuit board 10. That is, the end surface of the root part 16 of the protrusion structure 11 is higher than the second surface 13 (i.e., the bottom surface) of the circuit board.

Further, still referring to FIG. 1, in another example of the present application, the protrusion structure 11 of the photosensitive assembly is attached to the first surface 12 of the circuit board 10. The attachment can be welding or gluing.

Further, in another example of the present application, the protrusion structure may be a metal pillar or a metal dam. The metal pillars or metal dams can be obtained by providing a seed layer inside the circuit board and then planting a metal layer. The method of planting the metal layer includes methods such as electroplating, deposition or sputtering.

Figure 7:
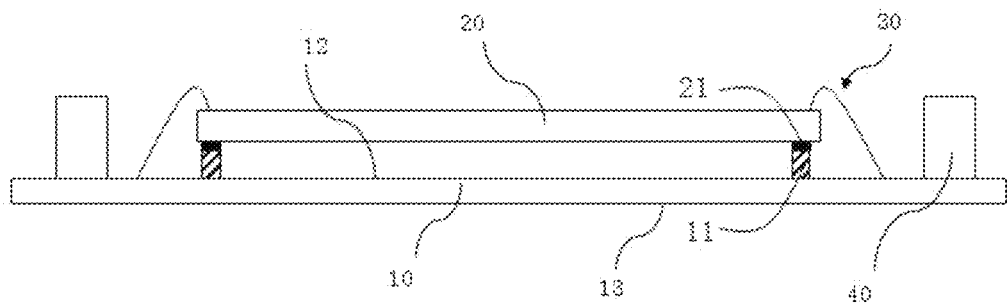
FIG. 7 shows a schematic cross-sectional view of a photosensitive assembly 1000 according to another example of the present application.
Figure 8:
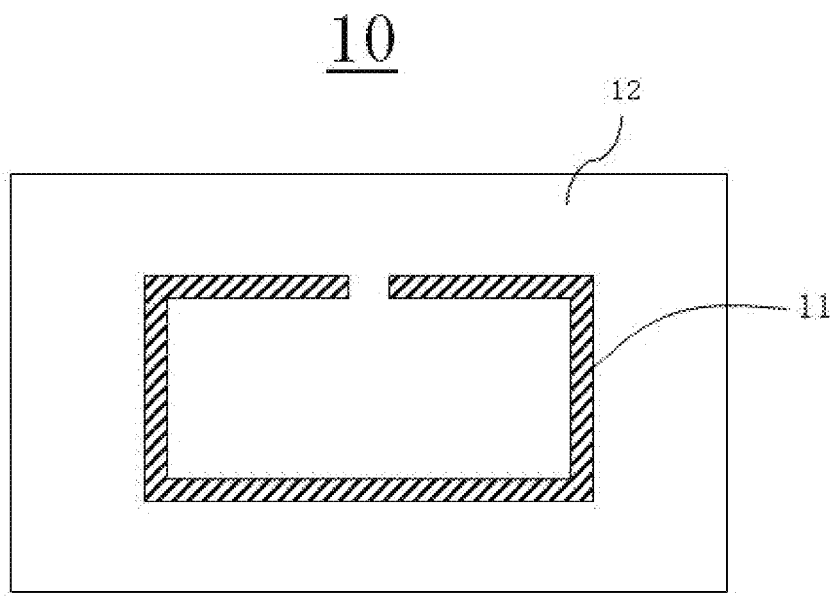
FIG. 8 shows a schematic top view of the circuit board 10 in the example of FIG. 7.

Further, FIG. 7 shows a schematic cross-sectional view of a photosensitive assembly 1000 according to another example of the present application. FIG. 8 shows a schematic top view of the circuit board 10 in the example of FIG. 7. With reference to FIGS. 7 and 8 in combination, in this example, the photosensitive element 1000 has the protrusion structure 11 and a bonding method that are different from those in the foregoing example. The photosensitive assembly 1000 includes the circuit board 10, the photosensitive chip 20, the metal wire 30 and the electronic component 40.

Herein, the circuit board 10 has the first surface 12 for attaching the photosensitive chip 20 and the second surface 13 opposite to the first surface 12. The first surface 12 has the protrusion structure 11, and the protrusion structure is distributed in the chip attachment area of the circuit board, and the top surface of the protrusion structure is flat. It should be noted that there is a gap between the first surface and the photosensitive chip in this example, and the two are only bonded at the protrusion structure 11. In this example, the protrusion structure is an unclosed ring-shaped dam, that is, the protrusion structure is an unclosed ring when viewed from a top view. The photosensitive chip 20 is attached to the first surface through an adhesive 21, wherein the adhesive 21 is arranged between the top surface of the protrusion structure 11 and the bottom surface of the photosensitive chip 20, and the adhesive 21 supports the photosensitive chip 20 after being cured. A protrusion height of the protrusion structure 11 is 10 micrometers to 30 micrometers. The metal wire 30 electrically connects the photosensitive chip 20 and the circuit board 10 by the wire bonding manner. The electronic component 40 is mounted on the first surface 12. Specifically, the electronic component 40 may be installed on an outer side of the metal wire 30. This structure makes a cavity between the photosensitive chip and the circuit board, reduces intermediate medium between the photosensitive chip and the circuit board, and reduces transmission of the circuit board stress to the photosensitive chip.

Further, according to another example of the present application, there also provides a method for manufacturing a photosensitive assembly, which includes the following steps S10-S40. Step S10 is preparing a circuit board. The circuit board has a first surface for attaching a photosensitive chip and a second surface opposite to the first surface, and the first surface has a protrusion structure, and the protrusion structure is distributed on a chip attachment area of the circuit board. In this example, a top surface of the protrusion structure may be flat. In one example, copper pillars may be formed on a surface of the circuit board by electroplating or deposition. Of course, in other examples, the protrusion structure may also be a pillar of other metal material formed on the first surface by electroplating or deposition. In this step, the user can make the circuit board by his/herself, or he/she can buy a circuit board embryonic board on the market for modification (note that there is no such product on the market at present, in other words, the circuit board 10 described in this step is not in prior art).

Step S20 includes: placing the first surface facing upwards, arranging an adhesive on the chip attachment area of the first surface, wherein the adhesive is arranged on at least the top surface of the protrusion structure. In this example, the adhesive is coated on the entire chip attachment area of the circuit board.

In step S30, the bottom surface of the photosensitive chip is brought into contact with the adhesive, and then the adhesive is cured, thereby bonding the photosensitive chip and the circuit board together.

In step S40, the photosensitive chip and the circuit board are electrically connected through a metal wire based on wire bonding. This step may further includes mounting electronic components on the surface of the circuit board.

Furthermore, in another example of the present application, the method for manufacturing the photosensitive assembly may further include step S50.

Step S50 is forming a molding portion on the first surface of the circuit board, wherein the molding portion surrounds the photosensitive chip, and there is a gap between the molding portion and the photosensitive chip, or the molding portion extends toward the photosensitive chip and contacts the photosensitive chip. Specifically, in this step, the molding portion can be made on the first surface of the circuit board by a molding process (the molding portion can embed the electronic components and/or metal wires), and the molding portion can be used as a lens holder for mounting a lens assembly. In the molding process, an upper die and a lower die can be used for clamping to form a molding cavity between the upper die and the first surface of the circuit board, and then a liquid molding material is injected into the molding cavity. After being cured and molded, the molding material is drafted to obtain a photosensitive component having a molding portion of a desired shape. It should be noted that, in still another example of the present application, step S50 can be replaced by a step of installing a shaped lens bracket. That is, the shaped lens bracket (i.e., lens holder) can be installed on the circuit board, and the lens holder can be used to install lens assemblies.

Further, in an example of the present application, in the step S10, the protrusion structure is a plurality of pillars distributed in the chip attachment area in a hash manner, or one or more bar-shaped dams. In the step S20, the adhesive is coated on the chip attachment area of the circuit board. In the step S30, the bottom surface of the photosensitive chip is brought into contact with the adhesive, and then the photosensitive chip is continuously pressed to squeeze the adhesive so that the adhesive fills a gap between the bottom surface of the photosensitive chip and the chip attachment areas. In this example, a top surface of the adhesive of the photosensitive assembly produced is flat and uniformly arranged in the chip attachment area, which can enhance the firmness and reliability of the adhesion between the bottom surface of the photosensitive chip and the circuit board. Further, in an example of the present application, the step S10 may include the following sub-steps S11 and S12.

Figure 9:
FIG. 9 shows a circuit board embryonic board 10a in an example of the present application.
Figure 10:
FIG. 10 shows a circuit board embryonic board 10b in another example of the present application.

Step S11 is preparing a circuit board embryonic board 10a, wherein the circuit board embryonic board 10a has a through hole or a slot, and the through hole or the slot has a metal seed layer 11a. FIG. 9 shows a circuit board embryonic board 10a in an example of the present application. The circuit board embryonic board 10a has a metal seed layer 11a. In this example, the metal seed layer 11a penetrates through the circuit board embryonic board 10a. FIG. 10 shows a circuit board embryonic board 10b in another example of the present application. The circuit board embryonic board 10b has a metal seed layer 10b, but the metal seed layer 10b does not penetrate through the circuit board embryonic board 10b, and is only made in one layer of the circuit board embryonic board 10b. Here, the circuit board embryonic board 10b may be a multi-layer board, in which wires can be arranged at each layer. In FIG. 10, the metal seed layer is made on the lowest bottom layer of the circuit board embryonic board 10b. In particular, in another example, the layer with the metal seed layer may not be used for wiring, that is, the layer where the metal seed layer is located does not belong to a part of the functional circuit in the circuit board. In this way, this layer can specifically play a role of structural support to strengthen the structural strength and improve the heat dissipation effect at the same time.

Step S12 is planting a metal layer on the metal seed layer so that the metal layer grows beyond the first surface to form the protrusion structure.

Furthermore, in an example of the present application, the step S12 may further include the following sub-steps.

Figure 11:
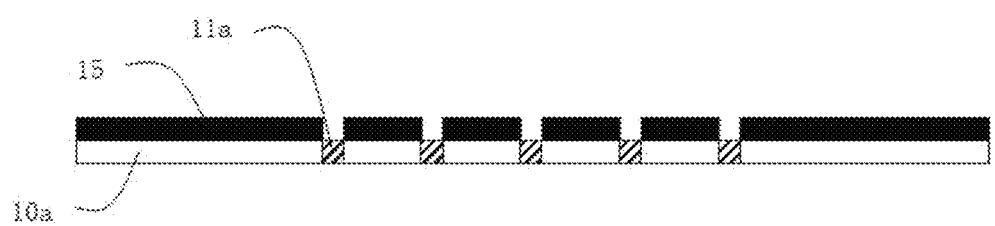
FIG. 11 shows a schematic diagram of covering a mask 15 on the upper surface of the circuit board embryonic board 10a in an example of the present application.

Step 121 is covering an upper surface of the circuit embryonic board with a mask, wherein the mask has an opening, and a longitudinal section of the opening has a first width, and a longitudinal section of the through hole or the slot has a second width, and the difference between the first width and the second width is less than 15% of the second width. FIG. 11 shows a schematic diagram of covering a mask 15 on an upper surface of the circuit board embryonic board 10a in an example of the present application.

Figure 12:
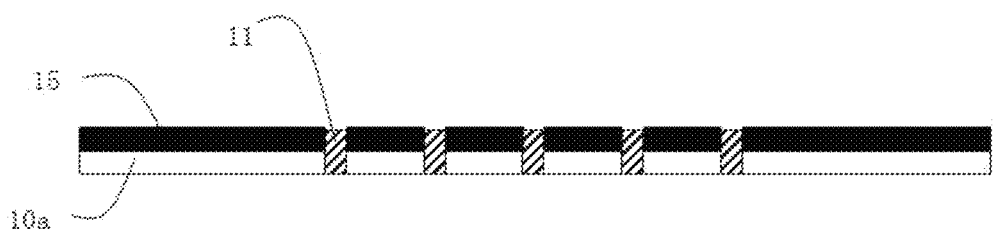
FIG. 12 shows a schematic diagram of growing metal pillars or metal dams on a seed layer in an example of the present application.

Step 122 is using electroplating, deposition or sputtering methods to grow a metal pillar or a metal dam on the seed layer in the through hole or the slot to form the protrusion structure beyond the first surface. FIG. 12 shows a schematic diagram of growing metal pillars or metal dams on a seed layer in an example of the present application. FIG. 12 shows the protrusion structure 11 obtained by growing the metal pillar or the metal dam on the seed layer.

Figure 13:
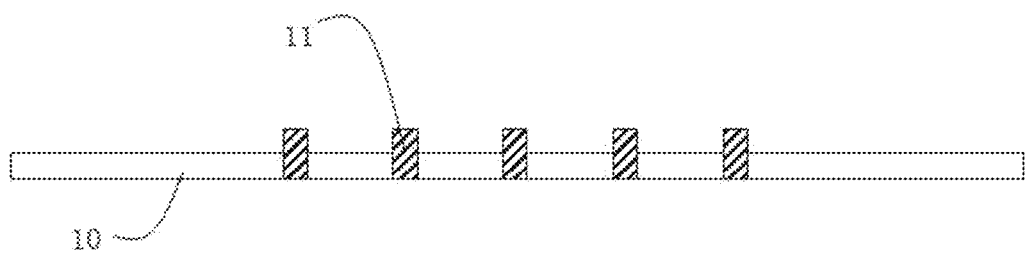
FIG. 13 shows a schematic diagram after removing the mask in an example of the present application.

Step 123 is removing the mask to obtain the required circuit board. FIG. 13 shows a schematic diagram after removing the mask in an example of the present application. As shown in FIG. 13, after removing the mask, the circuit board 10 with the required protrusion structure 11 can be obtained.

Further, in another example of the present application, in the step S10, the protrusion structure can be attached to the surface of the circuit board based on the SMT process (here, the circuit board can be understood as a circuit board embryonic board). Further, step S10 may also include attaching the electronic element to the first surface of the circuit board based on the SMT process. In this way, the protrusion structure and the electronic element can be completed in the same process step, so as to improve production efficiency.

Figure 14:
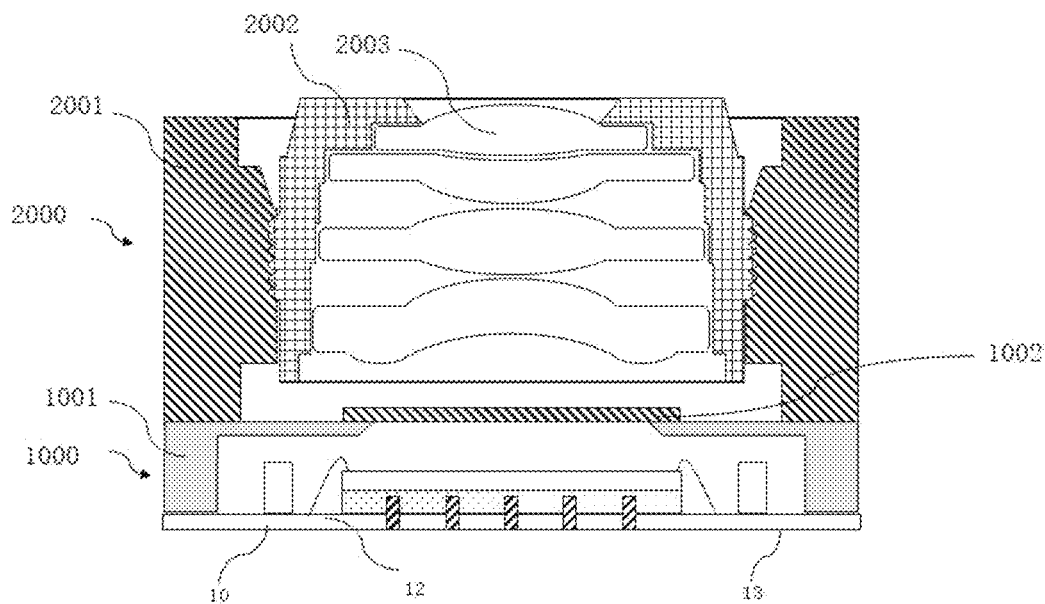
FIG. 14 shows a schematic cross-sectional view of a camera module according to an example of the present application.

Further, according to an example of the present application, there also provides a camera module, which includes a photosensitive assembly and a lens assembly. The photosensitive assembly may be the photosensitive assembly described in any one of the foregoing examples. The lens assembly can be with or without a motor. FIG. 14 shows a schematic cross-sectional view of a camera module of an example of the present application. It can be seen that the camera module include a photosensitive assembly 1000 and a lens assembly 2000. In this example, the photosensitive assembly 1000 is further provided with a lens holder 1001 and a color filter 1002 on the basis of the example in FIG. 1. The lens holder 1001 is installed on a first surface 12 of the circuit board 10. The lens holder 1001 has a light window. The color filter is mounted on the lens holder 1001. A top surface of the lens holder 1001 bears against a bottom surface of the lens assembly 2000. In this example, the lens assembly 2000 includes a motor 2001, a lens barrel 2002, and a lens group 2003. The lens group 2003 is installed on an inner side of the lens barrel 2002. An outer surface of the lens barrel 2002 is mounted on the motor (usually mounted on the motor carrier). The motor carrier can move relative to a housing of the motor, thereby driving the lens to move relative to the photosensitive assembly. This lens assembly with the motor can be used for autofocus camera modules, zoom camera modules, periscope camera modules, etc. The motor 2001 can also be replaced by a lens carrier. The lens carrier can be directly fixed on a top surface of the photosensitive assembly, and an inner side of the lens carrier and the outer side of the lens barrel can be threadedly connected. This lens assembly without the motor can be used for fixed-focus camera modules.

Figure 15:
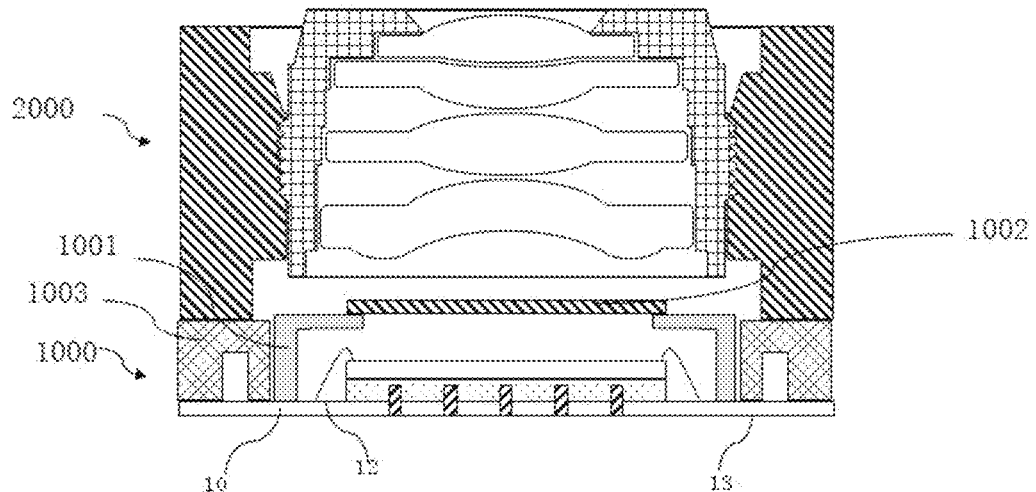
FIG. 15 shows a schematic cross-sectional view of a camera module according to another example of the present application.

Further, FIG. 15 shows a schematic cross-sectional view of a camera module according to another example of the present application. Referring to FIG. 15, in this example, the camera module includes a photosensitive assembly 1000 and a lens assembly 2000. The lens assembly 2000 may be the same as the lens assembly 2000 shown in FIG. 14, and will not be repeated here. In this example, the photosensitive assembly 1000 is further provided with a front molding portion 1003, and the front molding portion 1003 can be formed on a first surface 12 of a circuit board 10 through a molding process. The front molding portion 1003 may embed electronic elements. In this example, the front molding portion 1003 surrounds an outer side of a lens holder 1001, and a top surface of the front molding portion 1003 is a flat surface, which is used for mounting the lens assembly 2000.

Figure 16:
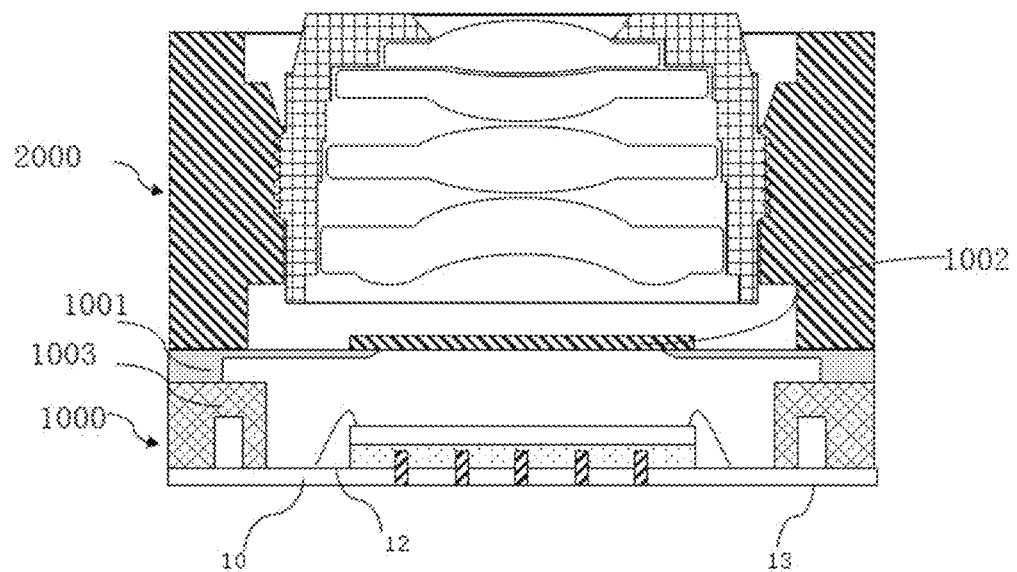
FIG. 16 shows a schematic cross-sectional view of a camera module according to still another example of the present application.

Further, FIG. 16 shows a schematic cross-sectional view of a camera module according to still another example of the present application. Referring to FIG. 16, in this example, the camera module includes a photosensitive assembly 1000 and a lens assembly 2000. The lens assembly 2000 may be the same as the lens assembly 2000 shown in FIG. 14, and will not be repeated here. In this example, the difference between the photosensitive assembly 1000 and that in FIG. 15 is an installation position of the lens holder 1001. In this example, the lens holder 1001 is installed on a top surface of the front molding portion 1003. The lens assembly 2000 is installed on a top surface of the lens holder 1001.

Figure 17:
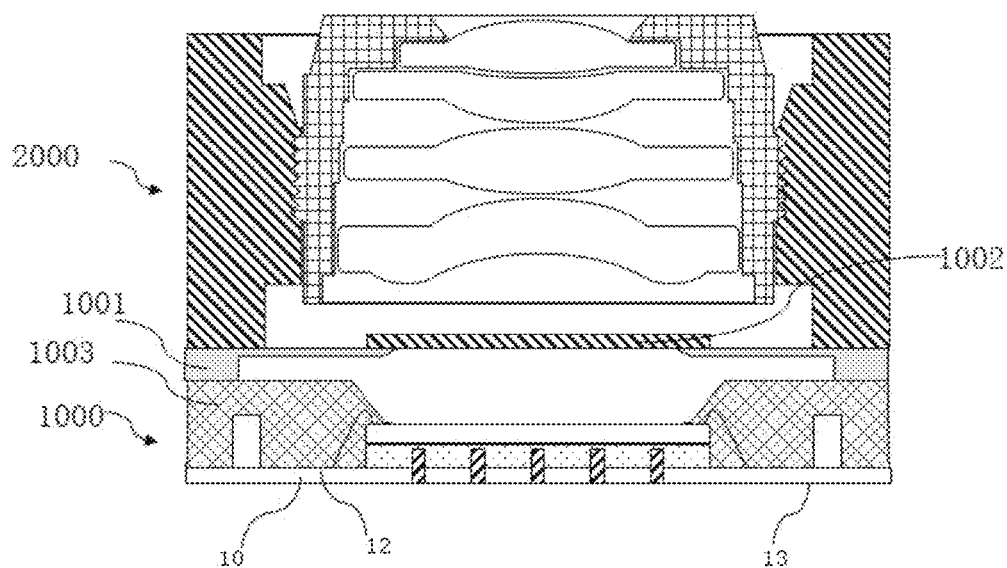
FIG. 17 shows a schematic cross-sectional view of a camera module according to yet another example of the present application.
Figure 18:
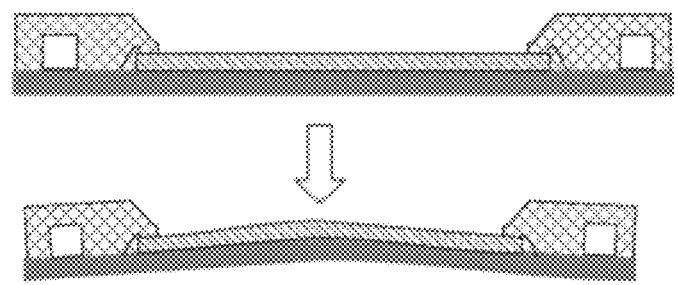
FIG. 18 shows a schematic diagram of a principle of a deformation of a photosensitive chip caused by bending of a circuit board and a molding body.

Further, FIG. 17 shows a schematic cross-sectional view of a camera module according to yet another example of the present application. Referring to FIG. 17, in this example, the camera module include a photosensitive assembly 1000 and a lens component 2000. The lens assembly 2000 may be the same as the lens assembly 2000 shown in FIG. 14, and will not be repeated here. In this example, the difference between the photosensitive assembly 1000 and that in FIG. 16 is a solution of the front molding portion 1003. In this example, the front molding portion 1003 adopts a MOC scheme, that is, the front molding portion 1003 is formed on a first surface 12 of a circuit board 10 through a molding process, and the front molding portion 1003 extends toward a photosensitive chip and embeds an edge area of the photosensitive chip. In this example, the front molding portion 1003 not only eembeds electronic elements, but also embeds metal wires (refers to the metal wires of the wire bonding process). In the example of FIG. 16, the front molding portion 1003 adopts a MOB scheme. In the MOB scheme, there is a gap between the front molding portion 1003 and the photosensitive chip. In this example, a lens holder 1001 is installed on a top surface of the front molding portion 1003. The lens assembly 2000 is installed on a top surface of the lens holder 1001.

The above description is only a preferred example of the application and an explanation of the applied technical principles. Those skilled in the art should understand that the scope of the invention involved in the present application is not limited to the technical solution formed by the specific combination of the above technical features, and should also cover the above technical solutions formed by any combination of the above technical features or their equivalent features without departing from the inventive concept. For example, a technical solution is formed by replacing the above-mentioned features with the technical features disclosed in this application (but not limited to) with similar functions.

The invention claimed is:

1. A photosensitive assembly, characterized by comprising:
   a circuit board having a first surface for attaching a photosensitive chip and a second surface opposite to the first surface, wherein the first surface has a protrusion structure, and the protrusion structure is distributed on a chip attachment area of the circuit board;
   a photosensitive chip attached to the first surface through an adhesive, wherein the adhesive is arranged at least between a top surface of the protrusion structure and a bottom surface of the photosensitive chip; and
   a metal wire electrically connects the photosensitive chip and the circuit board in a wire bonding manner;
   wherein the protrusion structure includes a first annular dam on an outer side and a second annular dam on an inner side, and a protrusion height of the first annular dam is greater than a protrusion height of the second annular dam.

2. The photosensitive assembly according to claim 1, wherein the adhesive covers the chip attachment area, and the top surface of the protrusion structure is a flat surface.

3. The photosensitive assembly according to claim 2, wherein the adhesive fills a gap between the bottom surface of the photosensitive chip and the chip attachment area, and a thickness of the adhesive is greater than a protrusion height of the protrusion structure.

4. The photosensitive assembly according to claim 3, wherein the protrusion structure is one or more strip-shaped dams.

5. The photosensitive assembly according to claim 4, wherein the strip-shaped dam is a linear dam, or a ring-shaped dam, or a tortuous dam formed by zigzag extension within the chip attachment area.

6. The photosensitive assembly according to claim 1, wherein a protrusion height of the protrusion structure is 5 micrometers to 40 micrometers.

7. The photosensitive assembly according to claim 6, wherein the protrusion height of the protrusion structure is 10 micrometers to 40 micrometers.

8. The photosensitive assembly according to claim 1, wherein the circuit board is a PCB board.

9. The photosensitive assembly according to claim 1, wherein the photosensitive assembly further includes a molding portion formed on the first surface and surrounding the photosensitive chip.

10. The photosensitive assembly according to claim 9, wherein there is a gap between the molding portion and the photosensitive chip.

11. The photosensitive assembly according to claim 10, wherein the molding portion extends toward the photosensitive chip and contacts the photosensitive chip, and the molding portion embeds the metal wire.

12. The photosensitive assembly according to claim 1, wherein a root part of the protrusion structure is located inside the circuit board, and the protrusion structure is grown based on a metal seed layer inside the circuit board.

13. The photosensitive assembly according to claim 12, wherein the root part of the protrusion structure extends to the second surface and penetrates through the circuit board.

14. The photosensitive assembly according to claim 1, wherein the protrusion structure is attached to the first surface of the circuit board.

15. The photosensitive assembly according to claim 14, wherein the protrusion structure is attached to the first surface of the circuit board through an SMT process.

16. The photosensitive assembly according to claim 1, wherein the protrusion structure is a metal pillar or a metal dam.

17. The photosensitive assembly according to claim 1, wherein the adhesive is arranged between the top surface of the protrusion structure and the bottom surface of the photosensitive chip and the adhesive is cured to support the photosensitive chip, and a protrusion height of the protrusion structure is 10 micrometers to 30 micrometers.

18. A camera module, characterized by comprising:
   a lens assembly; and
   the photosensitive assembly of claim 1.

* * * * *